United States Patent
Schleicher et al.

(10) Patent No.: US 10,680,605 B2
(45) Date of Patent: Jun. 9, 2020

(54) BIAS CIRCUIT AND METHOD FOR A HIGH-VOLTAGE RF SWITCH

(71) Applicant: Infineon Technologies AG, Neubiberg (DE)

(72) Inventors: Bernd Schleicher, Ebersberg (DE); Ruediger Bauder, Feldkirchen-Westerham (DE); Daniel Kehrer, Sauerlach (DE); Valentyn Solomko, Munich (DE)

(73) Assignee: INFINEON TECHNOLOGIES AG, Neubiberg (DE)

(*) Notice: Subject to any disclaimer, the term of this patent is extended or adjusted under 35 U.S.C. 154(b) by 0 days.

(21) Appl. No.: 15/908,087

(22) Filed: Feb. 28, 2018

(65) Prior Publication Data
US 2019/0267990 A1    Aug. 29, 2019

(51) Int. Cl.
| | | |
|---|---|---|
| *H03K 17/693* | (2006.01) | |
| *H03K 17/687* | (2006.01) | |
| *H01P 1/15* | (2006.01) | |
| *H03K 17/10* | (2006.01) | |
| *H04B 1/40* | (2015.01) | |

(52) U.S. Cl.
CPC ........... *H03K 17/6871* (2013.01); *H01P 1/15* (2013.01); *H03K 17/102* (2013.01); *H03K 17/693* (2013.01); *H04B 1/40* (2013.01)

(58) Field of Classification Search
CPC ............. H03K 17/6871; H03K 17/102; H03K 17/693; H01P 1/15; H04B 1/40
See application file for complete search history.

(56) References Cited

U.S. PATENT DOCUMENTS

| | | | | |
|---|---|---|---|---|
| 4,799,028 A | * | 1/1989 | Weaver | H03B 5/24 331/108 B |
| 2007/0159230 A1 | | 7/2007 | Heston et al. | |
| 2011/0002080 A1 | * | 1/2011 | Ranta | H03J 3/20 361/277 |
| 2011/0025404 A1 | | 2/2011 | Cassia | |
| 2011/0043284 A1 | | 2/2011 | Zhao et al. | |
| 2011/0148368 A1 | | 6/2011 | Burns et al. | |
| 2015/0270806 A1 | * | 9/2015 | Wagh | H03F 3/211 330/296 |
| 2016/0329891 A1 | | 11/2016 | Bakalski et al. | |

FOREIGN PATENT DOCUMENTS

WO    2014011510 A2    1/2014

OTHER PUBLICATIONS

Joseph, Allen et al., "Power Handling Capability of an SOI RF Switch," 2013 IEEE Radio Frequency Integrated Circuits Symposium, Jan. 2013, pp. 385-388.
Shifrin, M. et al., "Monolithic FET Structures for High-Power Control Component Applications," IEEE Trans. On Microwave Theory Techniques, vol. 37, No. 12, Dec. 1989, pp. 2134-2141.

(Continued)

*Primary Examiner* — Dong-Chang Shiue
(74) *Attorney, Agent, or Firm* — Slater Matsil, LLP

(57) ABSTRACT

An RF switch includes series-coupled RF switch cells coupled between an RF input and ground, each RF switch cell having an input, and a biasing network having outputs for individually biasing each of the RF switch cell inputs to a distinct bias voltage based upon a rank number of the RF switch cell.

18 Claims, 7 Drawing Sheets

(56) References Cited

OTHER PUBLICATIONS

Zhu, Yu et al., "Analytical Model of Voltage Division inside Stacked-FET Switch", Proceedings of the Asia-Pacific Microwave Conference, Dec. 2014, pp. 750-752.

Zhu, Yu et al., "High Voltage SOI Stacked Switch with Varying Periphery FETs", 2015 Asia-Pacific Microwave Conference (APMC), Dec. 2015, 3 pages.

* cited by examiner

US 10,680,605 B2

BIAS CIRCUIT AND METHOD FOR A HIGH-VOLTAGE RF SWITCH

TECHNICAL FIELD

The present invention relates generally to a bias circuit and method for a high-voltage RF switch.

BACKGROUND

RF switches having stacked transistors implemented as multiple RF cells are used in a variety of RF circuits to implement various functions in various applications. For instance, one application is a high voltage application such as a connection to an antenna in a cell phone. Multiple RF cells are typically coupled together so that any individual RF cell must only withstand a lower voltage that is a fraction of the high voltage and is thus within the breakdown voltage limits for the transistor manufacturing process used. While the use of multiple RF cells ideally evenly distributes the high voltage equally into low voltage portions across the individual RF cells, in practice the distribution of the high voltage can be unequal due to parasitic elements and effects. Linearity and other performance characteristics of the high voltage RF switch using multiple RF cells can thus be affected.

SUMMARY

An RF switch comprises a plurality of series-coupled RF switch cells coupled between an RF input and ground, each RF switch cell having an input; and a biasing network having a plurality of outputs configured for individually biasing each of the RF switch cell inputs to a distinct bias voltage based upon a rank number of the RF switch cell.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
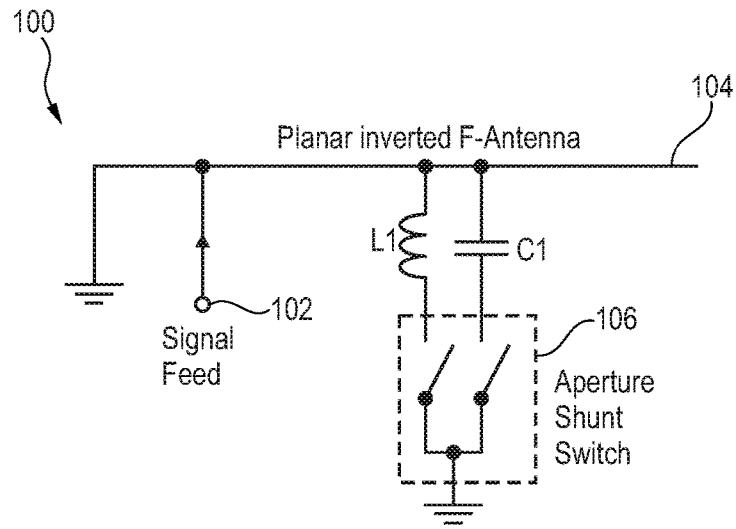
FIG. 1 is a schematic diagram of an antenna switch placed in an example antenna arrangement.

RF switches can be used as antenna aperture switches, which are used to improve the radiation performance of a mobile phone antenna. By operation of the RF switch, external inductances and/or capacitances can be switched-in at positions far from the feed-point of the antenna to tune the antenna so that it will radiate better at selected frequencies. The usage is illustrated in FIG. 1. FIG. 1 shows an antenna switch placed in an example antenna arrangement 100 including an RF signal feed 102, a planar inverted F-antenna, an inductor L1, and a capacitor C1.

Important figures of merit for such switches are its resistance in on-mode ($R_{on}$), its capacitance and resistance in isolation mode ($C_{off}$, $R_{off}$), and the maximal RF voltage swing it can withstand in isolation mode ($V_{RF}$). From the system application, it would be ideal to have $R_{on}$ and $C_{off}$ as small as possible and $R_{off}$ and $V_{RF}$ as high as possible, but realistically every switch technology provides its own inherent figures of merit like the $R_{on} \cdot C_{off}$ value and breakthrough voltage. RF switches are designed in body-biased bulk CMOS or Silicon-On-Insulator (SOI) technologies, using single or dual gate-oxide transistors. The nominal voltage withstood by one single transistor in isolation mode is typically in the range of 1.5 V to 3 V, but the required RF voltage swing is often much higher, e.g. 45 V to 80 V or even up to as much as 100 V. These high voltage operating conditions requires, in embodiments, a stacking of transistors up to a certain number, in order to handle the high voltage swings without breakdown.

By stacking, the voltage swing should be equally distributed between the drain and source node of the transistors, which takes place by the inherent gate-drain and gate-source capacitances of each transistor, see FIG. 2(a), described in further detail below. When stacked, the capacitances form a capacitive voltage divider. Typically a resistance $R_{ds}$ is placed between drain and source nodes of each transistor to DC bias the switch transistor. The locations of the elements in the stack can be seen in FIG. 2(b), which is also described in further detail below.

Figure 2:
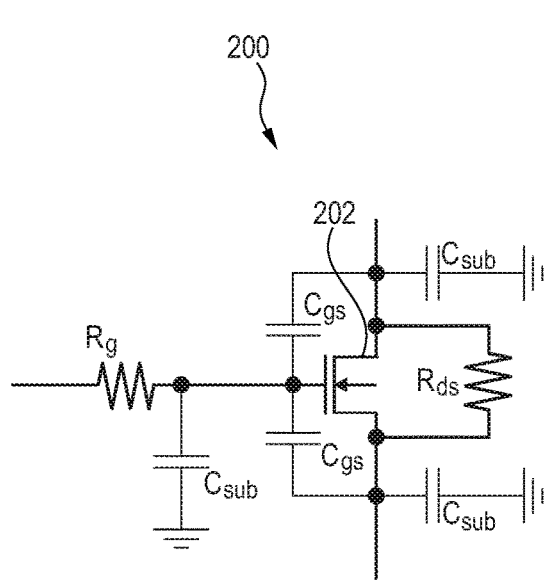
FIG. 2(a) is a schematic diagram of a single transistor unit cell with gate and drain-source resistances, as well as parasitic capacitances, according to an embodiment.
FIG. 2(b) is a schematic of a stacked transistor arrangement, including the drain-source capacitances that are used to counterbalance the parasitic substrate capacitance, according to an embodiment.
Figure 2:
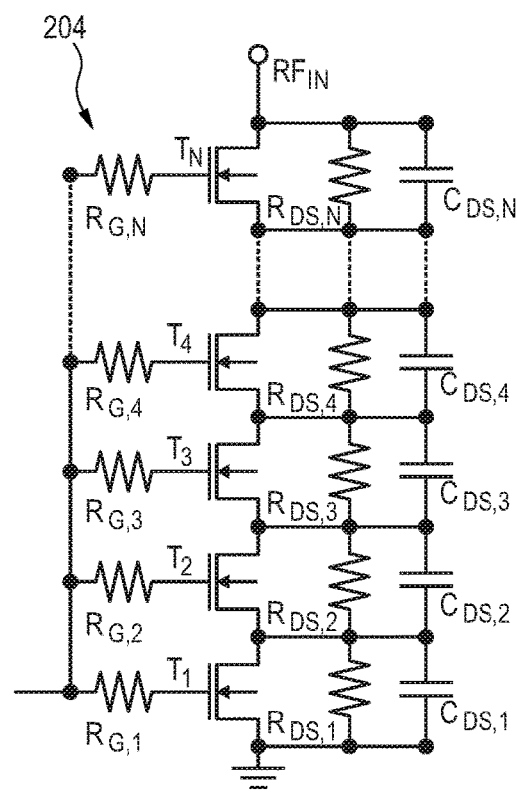

FIG. 2(a) shows a single transistor unit cell 200 including transistor 202 with gate and drain-source resistances $R_g$ and $R_{ds}$ as well as parasitic capacitances $C_{gd}$, $C_{gs}$ and three substrate capacitances $C_{sub}$.

FIG. 2(b) shows a stacked transistor arrangement 204, including the drain-source capacitances $C_{DS,1}$ $C_{DS,2}$ $C_{DS,3}$, $C_{DS,4}$ through $C_{DS,N}$, which are important to counterbalance the parasitic substrate capacitance. Also shown in FIG. 2(b) are RF switch transistors $T_1$, $T_2$, $T_3$, $T_4$, through $T_N$, drain-source resistors $R_{DS,1}$, $R_{DS,2}$, $R_{DS,3}$, $R_{DS,4}$ through $R_{DS,N}$, and gate resistors $R_{G,1}$, $R_{G,2}$, $R_{G,3}$, $R_{G,4}$, through $R_{G,N}$.

However, there are two main effects, which limit the ideal equal distribution of the RF voltage and the handling of the RF voltage.

One effect is caused by inherent small parasitic capacitances from drain, gate and source to common ground potential, here called $C_{sub}$, which causes the voltage distribution to become unequal. See FIG. 2(a) for the location of $C_{sub}$. This unequal distribution limits the sustainable overall RF voltage swing and causes a reduced voltage handling of the device, because one transistor experiences a larger voltage swing than the others and therefore has an earlier breakdown. $C_{sub}$ includes two components: a semiconductor capacitance, caused by floating electrons; and an electromagnetic field to ground due to the metallization. The influence of the semiconductor substrate capacitance can be strongly reduced by reducing the amount of floating electrons in the substrate node. This is done by applying a negative voltage of e.g. $V_{sub}$=−2 V to −10 V to the substrate node (called: body-biasing) to remove the carriers from the substrate and by this to reduce the parasitic capacitances which are causing the imbalance. However, the parasitic capacitance to ground due to the EM field still exists. The voltage imbalance due to parasitic capacitances to ground can further be mediated or even compensated by adding an additional capacitance $C_{ds}$ between drain and source of each transistor, see FIG. 2(b), each having an adjusted value to counterbalance the RF voltage imbalance. However, adding capacitances in parallel to the transistor capacitances increases the isolation mode capacitance ($C_{off}$) of the switch. Here, all transistor stacks are simulated without $C_{sub}$ influence, which is achieved by fully compensating this effect by adding appropriate values for $C_{ds}$.

Figure 3:
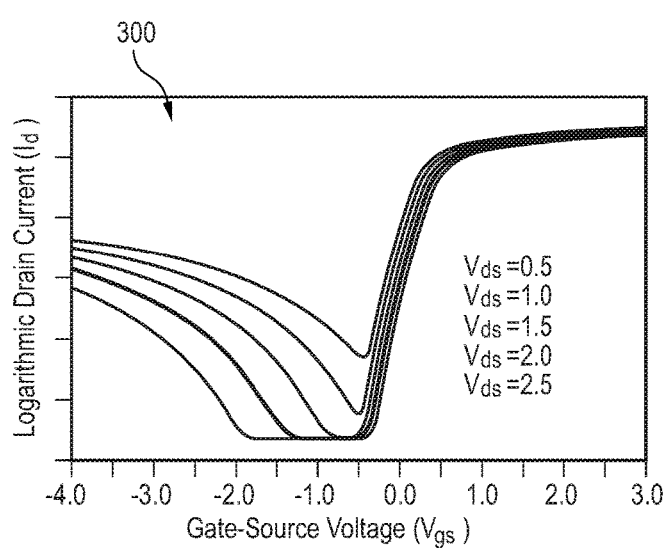
FIG. 3(a) is a logarithmic IV-curve of an embodiment switch transistor, wherein, at negative bias voltages, the increase in drain current $I_d$ is due to gate-induced drain leakage (GIDL)
FIG. 3(b) is a plot of leakage and GIDL currents flowing from ground to a negative substrate potential building up a negative voltage at the drain nodes due to the drain-source resistances.
Figure 3:
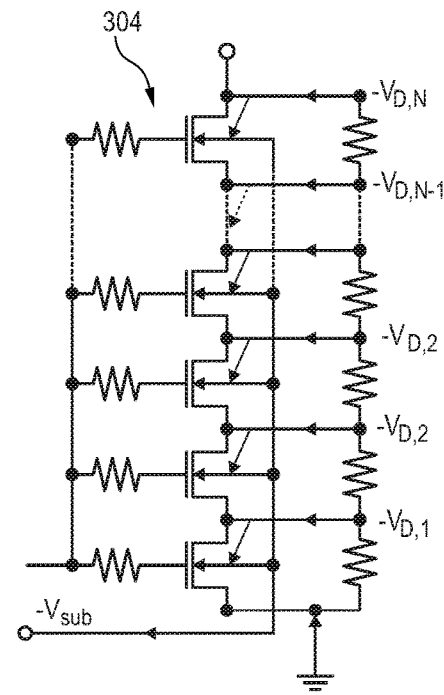

A second effect, which limits the RF voltage handling, is due to diode leakage current and gate-induced drain leakage (GIDL) current of the transistors. These leakage currents are inherent to the transistor technology and are causing a current flow from drain and source to the negative-biased substrate node. The DC IV-curve 300 of an embodiment transistor can be seen in FIG. 3(a), and is described in further detail below. Here, an increase of drain current $I_d$ due to GIDL can be seen at negative $V_{gs}$ voltages. The negative voltage is applied to the transistors' gate to keep the transistor off. The GIDL increase is stronger when there is an increased drain-source voltage $V_{ds}$ present. The RF voltage swing increases the current into the substrate node even further due to self-basing effect. Because of this current flow through the drain-source resistances $R_{ds}$, the negative voltage at the drain nodes increases further. The leakage current flow and the build-up of the drain voltage $-V_{d,n}$, is illustrated in FIG. 3(b), which is also described in further detail below. Two main effects could reduce the voltage loading, but both have drawbacks. The voltage loading would become smaller, when choosing a smaller value of $R_{ds}$ but the resistance in isolation mode $R_{off}$ would become smaller, too. The voltage loading would as well become smaller, when the substrate voltage would be less negative, but this would increase the parasitic capacitance $C_{sub}$ and result in a larger unequal distribution.

Next, graphical visualizations for the design of the switch are shown, which highlight the interactions when varying certain parameters.

FIG. 3(a) shows the logarithmic IV-curve 300 of an embodiment switch transistor. At negative bias voltages, the increase in drain current Id is due to gate-induced drain leakage (GIDL). Note in FIG. 3(a) that curve 300 includes a series of curves measured at different drain-source voltages.

FIG. 3(b) is a schematic diagram illustrating the leakage and GIDL currents flowing from ground to negative substrate potential building up a negative voltage at the drain nodes due to the drain-source resistances. The schematic shown in FIG. 3(b) is substantially the same as the schematic shown in FIG. 2(b), but with the previous text labels removed for clarity. The current flow path is shown in FIG. 3(b) and also the negative drain voltages $-V_{D,1}$, $-V_{D,2}$, $-V_{D,3}$, through $-V_{D,N-1}$, $-V_{D,N}$.

In isolation state operation, the transistor is biased with a negative gate voltage $V_{gs}$ e.g. in the range of −2 V to −3 V and additionally a negative substrate voltage $V_{sub}$ of e.g. −2 V to −6 V. As will be described in further detail below with respect to drawing FIGS. 4(a) and 4(b), an RF swing is imposed on the RF input of a transistor path with for example an input power $P_{in}$=48 dBm, which represents an RF voltage swing of e.g. 80 V. The RF voltage distributes amongst the drain and gate nodes, because of the capacitive voltage divider formed by $C_{gd}$ and $C_{gs}$. When plotting the transient gate-source voltage $V_{gs}$ of each transistor at the x-axis and the transient drain current Id of the same transistor on the y-axis, a locus curve of each individual transistor can be plotted. When putting the locus curve above the DC IV curve, its location can be viewed in relation to each other. This can be seen in FIG. 4(a) in the case of an ideal 32 transistor stack without leakage, GIDL and detuning due to $C_{sub}$. As can be seen the locus curves of all transistors are located above each other, which represents the ideal situation.

Figure 4:
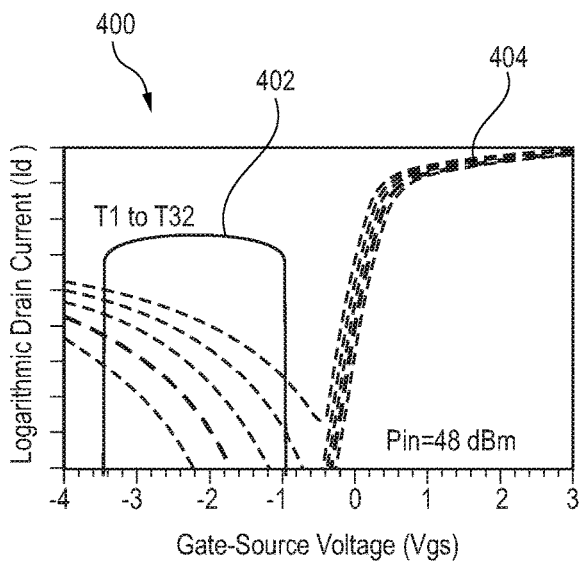
FIG. 4(a) is an overlay plot of a locus curve of drain current versus gate-source voltage of the RF swing of each of the single transistors (solid) and the DC IV-curve of a single transistor (dotted, and the same curve as is shown in FIG. 3(a)) for an ideal transistor without leakage, GIDL and substrate capacitance, wherein the curves of the different transistors ideally overlap.
FIG. 4(b) is a similar plot to FIG. 4(a), but of a transistor with leakage, with GIDL, but no substrate capacitance, wherein the higher the rank number of transistor in the stack, the larger is the shift of the transistor towards the subthreshold region.
Figure 4:
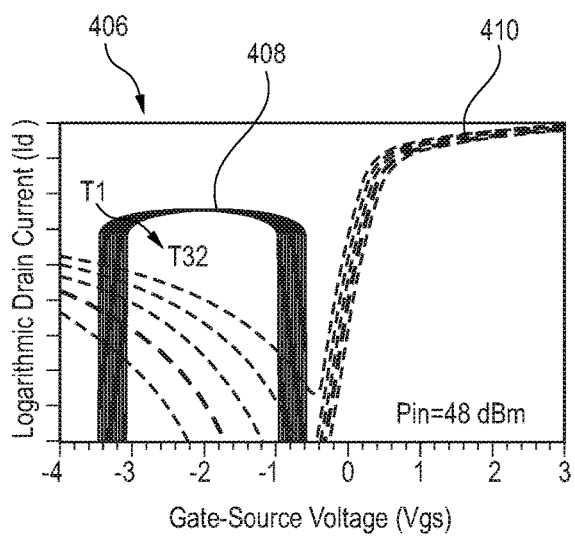

FIG. 4(a) thus shows an overlay 400 of a locus curve 402 of drain current vs. gate-source voltage of the RF swing of each of the single transistors (solid) and the DC IV-curve 404 of a single transistor (dotted, and the same curve as is shown in FIG. 3(a)) for (a) an ideal transistor without leakage, GIDL and substrate capacitance. The curves of the different transistors $T_1$ through $T_{32}$ overlap ideally, wherein the transistor number refers to a rank number of the transistor measured from a first place in the rank nearest to ground to a last place in the rank nearest to the RF input source.

FIG. 4(b) shows the transistor with leakage, with GIDL, but no or fully compensated substrate capacitance. The higher the transistor in the stack, the larger is the shift of the transistor to the subthreshold region. As can be seen, the overlay 406 of the locus curve 408 of each transistor $T_1$ through $T_{32}$ with the DC IV curve 410 changes its DC position. The higher the transistor in the stack ($T_{32}$), the closer the locus curve 408 shifts to the activation region, also called the subthreshold region, of the transistor. When the gate-source curve of the highest transistor ($T_{32}$) approaches the subthreshold region, the transistor partially activates during an RF swing and causes distortion. The situation of an actual impingement into the subthreshold region is not shown in the graphs of FIG. 4(a) and FIG. 4(b), but for a proper operation this region is ideally to be avoided. The curve shift takes place because of the loading of each drain node due to the GIDL currents. This DC loading of each drain node to ground can be seen in FIG. 5(a), described in further detail below, for a comparison between the above mentioned simulations with and without GIDL currents. The lowest transistor in the stack ($T_1$) is at the most left side; the highest transistor is plotted at the most right side ($T_{32}$).

Figure 5:
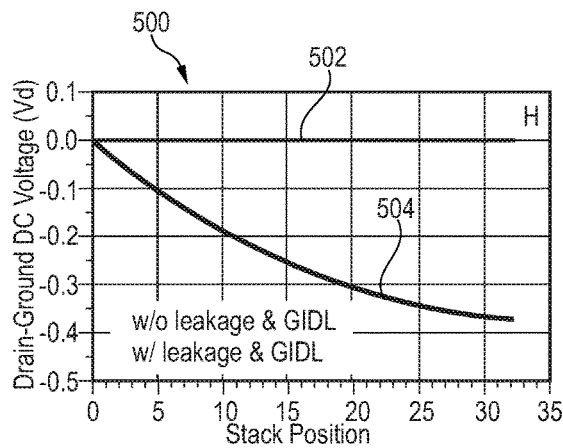
FIG. 5(a) is a plot of DC voltage loading of the drain node versus rank number in the stack with an applied RF voltage swing, wherein leakage and GIDL are shown causing a significant loading.
FIG. 5(b) is a plot of gate voltage of the different stack transistors with an applied RF voltage swing, wherein a shift due to leakage and GIDL is shown.
Figure 5:
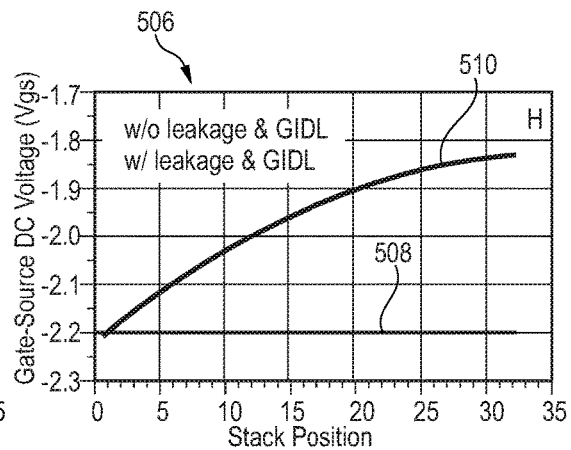

FIG. 5(a) shows a DC voltage loading of the drain node versus transistor number in the stack at an applied RF input power. It can be seen that leakage and GIDL cause a significant loading due to self-biasing with the input power. For example, curve 502 is flat and shows no loading when leakage currents and GIDL are removed. Curve 504 shows significant loading, especially at the higher ranked transistor numbers.

FIG. 5(b) similarly shows the gate voltage of the different stack transistors with applied RF voltage swing. The shift due to leakage and GIDL can be clearly seen. For example, curve 508 is flat and shows no loading when leakage currents and GIDL are removed. Curve 510 shows significant loading, especially at the higher ranked transistor numbers.

This loading of the drain nodes reduces the biasing gate-source voltage $V_{gs}$ of the corresponding transistor in the stack, as can be seen in FIG. 5(b), and shifts the voltage swing of the higher transistors closer to the unwanted subthreshold region.

Figure 6:
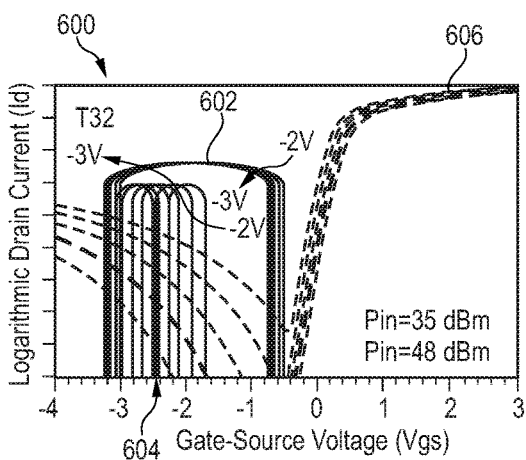
FIG. 6(a) is a plot of locus curves of the highest transistor in the stack at different $V_{gs}$ voltages and two example input power levels, wherein at low input powers, the shift in locus position changes, but for higher input power, the shift of the locus only changes slightly.
FIG. 6(b) is a plot of loading of the drain nodes at different stack position and with the input powers.
FIG. 6(c) is a plot of gate voltage loading at DC values of the gate-source for each transistor in the stack wherein particularly at high input powers, the effect of the GIDL currents is shown.
Figure 6:
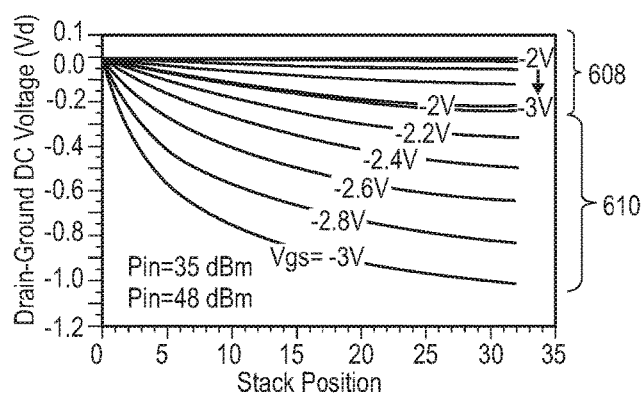
Figure 6:
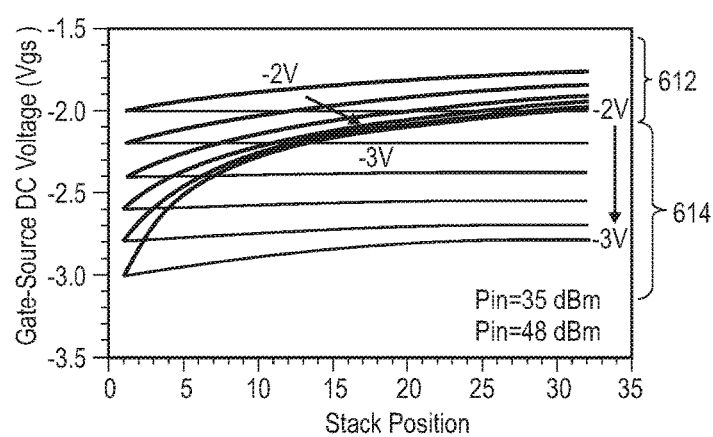

One possible biasing embodiment would be to change the gate voltage to a more negative voltage and therefore bring it further away from the subthreshold region. When simulating this approach, a simulation was done using a sweep of $V_{gs}$=−2 V to −3 V. Additionally two input powers were used, $P_{in}$=35 dBm and 48 dBm. As can be seen in the graph 600 of FIG. 6(a) at the lower input power, the curve shift 604 with decreasing $V_{gs}$ takes place as anticipated, but at the higher input power the shift 602 is only marginally effective. By decreasing the negative gate biasing, the more GIDL current is generated, which increases the drain loading and by this compensates the more negative gate voltage. Therefore only a slight shift of the locus curve takes place. The drain loading of the voltage can be seen in FIG. 6(b) and the gate-source voltage in FIG. 6(c) shows the change of the stacked transistors to the critical subthreshold region. All three figures are described in further detail below.

FIG. 6(a) show locus curves 602 and 604 of the highest transistor ($T_{32}$) in the stack at different Vgs voltages present to the gates of all transistors. Additionally, two input powers (35 dBm and 48 dBm) are used. It can be seen, that at low input powers, the shift in locus position towards the lower gate voltage supply changes, but for higher input power, the shift of the locus does only changes slightly. This is due to present leakage and GIDL currents, which compensate the decreasing voltage by increasing voltage loading. Only small headroom benefit (the voltage difference between the locus curve 602 and the DC IV curve 606) is obtained.

FIG. 6(b) shows the loading of the drain nodes at different stack positions and with the two different input powers. This simulation shown in FIG. 6(b) supports the above mentioned findings. Traces 608 represent the drain voltage loading at different Vgs voltages at an input power of 35 dBm. Traces 610 represent the drain voltage loading at different Vgs voltages at an input power of 48 dBm.

FIG. 6(c) shows the DC values of the gate-source voltage versus the rank number of each transistor in the stack. It can be seen, that at high input powers, the benefit is mitigated by the occurring GIDL currents. Traces 612 represent the gate voltage loading at different Vgs voltages at an input power of 35 dBm. Traces 610 represent the gate voltage loading at different Vgs voltages at an input power of 48 dBm.

Embodiments, therefore, to bias the gates of the transistors in a stacked RF switch individually and to present an individual voltage with a defined slope to the gates are explained in further detail below. The defined slope is defined against the rank order (position) of the transistor in the RF switch.

Figure 7:
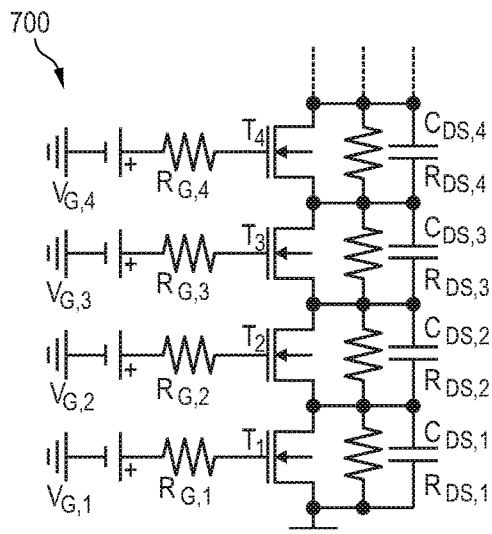
FIG. 7(a) is a schematic diagram of a biasing arrangement with a separate gate voltage for each transistor in the stack, according to an embodiment.
FIG. 7(b) is a schematic diagram of a biasing arrangement using a single supply voltage also having a separate gate voltage for each transistor in the stack, according to an embodiment.
Figure 7:
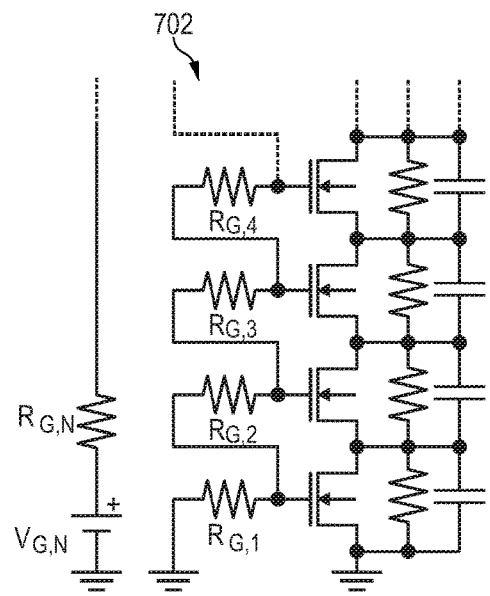

An embodiment circuit 700 is shown in FIG. 7(a), wherein each gate is supplied with a separate gate voltage supply. FIG. 7(a) shows transistors $T_1$, $T_2$, $T_3$, $T_4$, of a plurality of transistors in a stacked RF switch, drain-source resistors $R_{DS,1}$, $R_{DS,2}$, $R_{DS,3}$, $R_{DS,4}$ of a plurality of drain-source resistors, capacitors $C_{DS,1}$, $C_{DS,2}$, $C_{DS,3}$, $C_{DS,4}$ of a plurality of capacitors, gate resistors $R_{G,1}$, $R_{G,2}$, $R_{G,3}$, $R_{G,4}$ of a plurality of gate resistors, and individual bias voltage $V_{G,1}$, $V_{G,2}$, $V_{G,3}$, $V_{G,4}$ of a plurality of individual bias voltages for applying a distinct bias voltage along a defined slope with respect to the rank order of the corresponding transistor in the RF switch.

An example embodiment 702 is shown in FIG. 7(b), where a single voltage supply $V_{G,N}$ and a resistive divider network ($R_{G,1}$, $R_{G,2}$, $R_{G,3}$, $R_{G,4}$ through $R_{G,4}$) are used to provide the separate and distinct gate voltages. Depending on the value of the single supply voltage, and on the resistance values at the gate side, it will be appreciated by those skilled in the art that a wide range of linear slopes with respect to the rank order of the corresponding transistor can be applied. It should be noted that the implementation 702 in FIG. 7(b) draws a small current through the gate resistance network and that the resistance closest to the voltage supply sees a large RF swing and thus needs to be designed to withstand the associated dissipated power.

FIG. 7(a) thus shows a biasing embodiment for supplying the transistors in a stack with a separate gate voltage according to a defined slope.

FIG. 7(b) thus shows a biasing embodiment for supplying the transistors with a separate gate voltage from a single supply voltage according to a defined slope.

Figure 8:
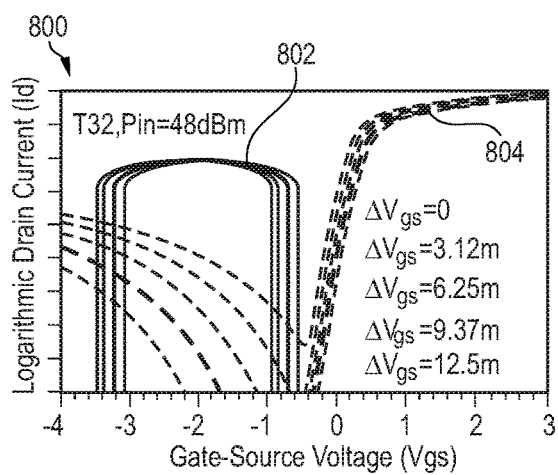
FIG. 8(a) is a plot of locus curves of the highest transistor in the stack, with different $V_{gs}$ slopes of the gate voltage supply, wherein the locus curves move away from the critical subthreshold transistor curve.
FIG. 8(b) is a plot of drain voltage loading in the stack for different $V_{gs}$ slopes.
FIG. 8(c) is a plot of DC curves of the gate-source voltage of each transistor in the stack for different $V_{gs}$ slopes.
Figure 8:
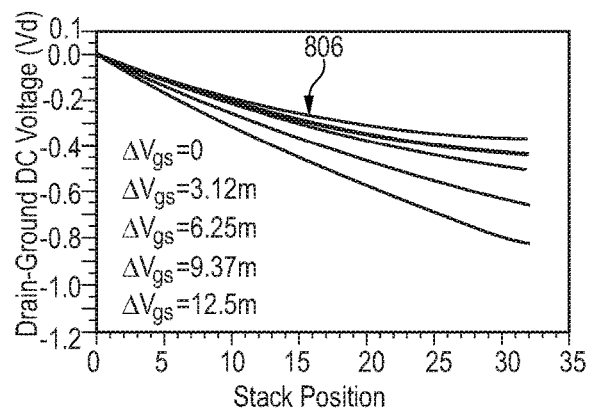
Figure 8:
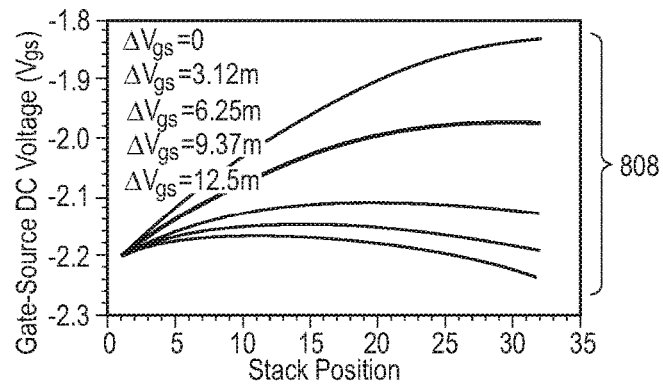

When supplying the transistors with the above-described gate biasing arrangement, different slopes could be chosen. Here, the voltage increases linearly from a low voltage at the gate of the lowest transistor ($T_1$) to a higher voltage at the gate of the highest transistor ($T_{32}$). The individual gate voltage $V_{g,n}$ is calculated by equation (1):

$$V_{g,n}=V_{gs,fix}\cdot(1+[(n-1)\cdot\Delta V_{gs}]) \qquad (1)$$

wherein $V_{gs,fix}$ is the voltage of the lowest transistor, n is the number of the transistor in the stack counted from the bottom and $\Delta V_{gs}$ is the linear slope increase between each transistor. A comparison of different slopes $\Delta V_{gs}$ and $V_{gs,fix}$=−2.2 V can be seen in the overlay 800 of FIG. 8(a) in the locus curves 802 and in FIG. 8(b) for the voltage of drain to ground 806. It can be seen, in FIG. 8(a) that the locus curves 802 are moving in a negative direction and by this, away from the critical subthreshold region shown in the DC IV curve 804. Interestingly, as can be seen in FIG. 8(b), the drain voltage loading increases as well, but the increase is less and with a different shape compared to that previously shown in FIG. 6(b). The gate-source voltage behavior 808 across the transistor stack can be seen in FIG. 8(c). It can be seen, that by increasing $\Delta V_{gs}$, i.e. more negative gate-voltage from bottom to top, the gate-source voltages become flatter. This means, that the shift due to GIDL is reduced in contrast to a fixed negative voltage, applied to all transistors.

FIG. 8(a) thus shows locus curves of the highest transistor in the stack ($T_{32}$), with different Vgs-slopes of the gate voltage supply. The locus curves 802 move away from the critical subthreshold transistor curve for larger slope values.

FIG. 8(b) thus shows drain voltage loading 806 in the stack for different Vgs-slopes.

FIG. 8(c) thus shows DC curves 808 of the gate-source voltage of each transistor in the stack. The change in headroom, as previously described, with respect to the defined slope, as also previously defined, can be clearly seen.

Figure 9:
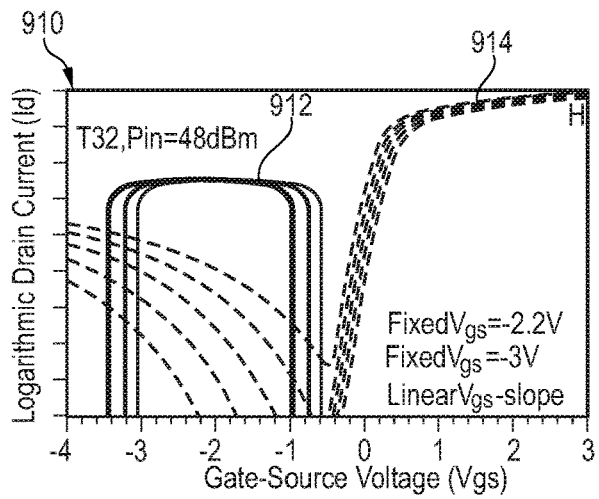
FIG. 9(a) is a plot of the comparison of locus curves of the highest transistor in the stack, between fixed gate supplies to all transistors and a linear Vgs slope, showing the improvement of the linear $V_{gs}$ slope.
FIG. 9(b) is a plot of the drain voltage loading in the stack between the fixed gate supplies and the linear $V_{gs}$ slope.
FIG. 9(c) is a plot of DC voltage of the gate-source voltages versus stack position.
Figure 9:
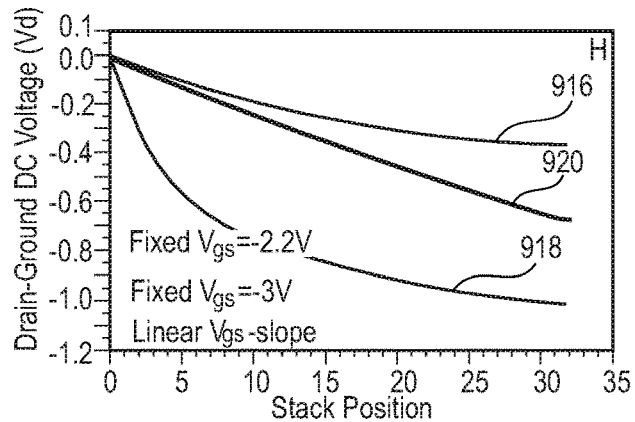
Figure 9:
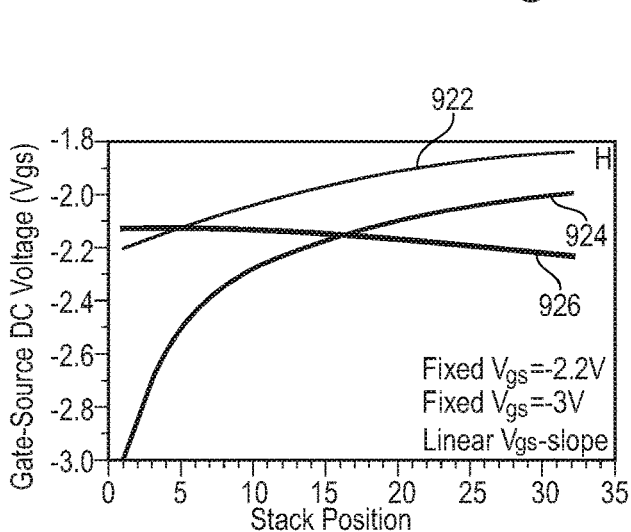

In FIGS. 9(a), (b), and (c) a comparison is shown between a design with a fixed gate voltage $V_{gs}$=−2.2 V, a fixed gate voltage $V_{gs}$=−3 V and a linear $V_{gs}$-slope from −3 V of the highest transistor ($T_{32}$) to −2.2 V of the lowest transistor ($T_1$), as previously shown in FIGS. 8(a), (b), and (c) for the case of $\Delta$Vgs=12.5 mV. The input power level is again shown as $P_{in}$=48 dBm. When looking at the overlay 910 of FIG. 9(a), it can be seen, that the locus 912 of the highest transistor in the stack ($T_{32}$) locates the most towards the negative voltages for the $V_{gs}$-slope case and provides the largest distance away from the critical subthreshold region shown in the DC IV curve 914. This is also supported by the graph shown in FIG. 9(c), where the gate-source voltage of each transistor is showing the lowest voltage at the higher transistors. As can be seen, the headroom benefit is not only present at the highest transistor in the stack, but present at the other transistors as well. Traces 922 and 924 represent a fixed $V_{GS}$ voltage, whereas trace 926 represents a $V_{GS}$-slope voltage. From FIG. 9(b) the voltage loading of the drain nodes can be seen and compared. Traces 916 and 918 represent a fixed $V_{GS}$ voltage, whereas trace 920 represents a $V_{GS}$-slope voltage. The simulation results support the above description.

FIG. 9(a) thus shows a comparison of locus curves 912 of the highest transistor in the stack, between fixed gate supply voltages to all transistors and a linear $V_{gs}$-slope, showing the improvement of the linear $V_{gs}$-slope.

FIG. 9(b) thus shows drain voltage loading in the stack between the fixed gate supplies and the linear $V_{gs}$-slope.

FIG. 9(c) thus shows the DC voltage of the gate-source voltages versus stack position.

The increased headroom to subthreshold activation, which the gradual gate biasing according to embodiments offers, can be used in various ways. This depends mainly on the optimization goals of the circuit. It can be used to increase the voltage handling of a given transistor stack, increase the drain-source resistances $R_{ds}$ and by this $R_{off}$, decrease the number of stacked transistors and therefore reduce area consumption, or can be used to decrease the ballasting capacitances to decrease $C_{off}$. Increased gate voltage biasing to the upper transistors and switching time of the RF switch should be monitored carefully.

Figure 10:
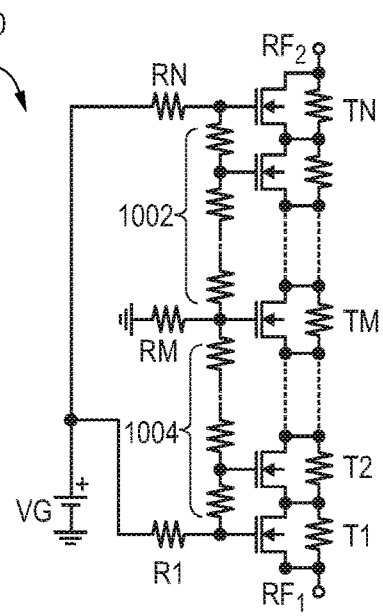
FIG. 10 is a schematic diagram of a gate supply biasing network for a series switch according to an embodiment.

In some applications a series RF switch is required, meaning that both poles of the switch may see high RF voltage. For example, a switch in FIG. 10 has two RF ports $RF_1$ and $RF_2$, any of which can be attached to high RF voltage, while the other one may be shorted to ground. In such a switch the transistors at the end of the stack (coupled to ports $RF_1$ and $RF_2$) shall be supplied with high negative bias voltage (for example, −3V), while the transistor in the middle shall be supplied with low negative bias voltage (for example, −2V). This can be implemented by configuring the gate resistive network as shown in FIG. 10, where top and bottom transistors are supplied from a high negative voltage source via high-ohmic resistors, while the transistor in the middle of the stack is tapped to ground via a high-ohmic resistor. The gate voltage at each transistor along the stack from the RF port to the middle transistor is calculated by equation (2) as:

$$V_{g,n}=V_{gs,fix}\cdot(1+[(n/2-1)\cdot\Delta V_{gs}]) \qquad (2)$$

where $V_{gs,fix}$ is the voltage at the transistor attached to the RF port, n is the total number of transistor in the stack counted from the transistor attached to the RF port, and $\Delta V_{gs}$ is the linear slope increase between each transistor. Thus, the gate supply voltage will drop linearly from one side of the stacked switch until the middle transistor and then increase with the same rate from the middle transistor to the other side of the stacked switch.

The transistor with a lowest negative gate voltage may not necessarily be in the very middle of the stack—it may also be located somewhere in between the transistors attached to RF ports.

FIG. 10 thus shows an embodiment 1000 of a gate supply network for a series switch including a first plurality of transistors $T_1$ through $T_M$ extending from a first RF port $RF_1$ to an intermediate lowest bias voltage as described above, and a second plurality of transistors $T_M$ through $T_N$ extending from the intermediate lowest bias voltage as described above to a second RF port $RF_2$. Also shown in FIG. 10 are gate resistors $R_N$, $R_M$, and $R_1$ coupled together to a source of biasing voltage $V_G$. A first voltage divider 1002 is used to distribute a sloped voltage to the corresponding transistors in the upper portion of switch embodiment 1000, and a second voltage divider 1004 is used to distribute a sloped voltage to the corresponding transistors in the bottom portion of switch embodiment 1000. The exact values of the resistors and bias voltage are easily calculated by those skilled in the art, especially since in many applications the gate resistance value of the transistors can be ignored in the calculation when compared to the resistance value of the biasing resistors.

Figure 11:
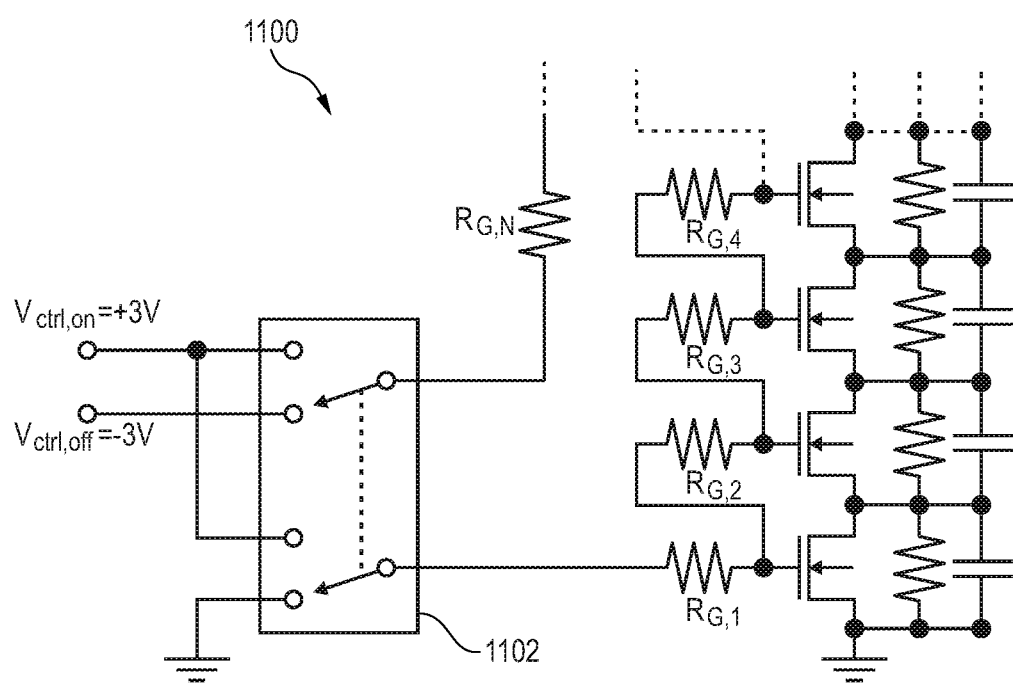
FIG. 11 is a schematic diagram of a bias switching circuit for providing equal bias voltages in an ON operational mode and distinct biasing voltages having a linear slope in an OFF operational mode.

FIG. 11 is a schematic diagram of a bias switching circuit 1100 for providing equal bias voltages in an ON operational mode and distinct biasing voltages having a linear slope in an OFF operational mode. In the OFF operational mode switch 1102 is in the bottom position, wherein the negative bias voltage of −3 V ($V_{crtl,off}$) is distributed according to a defined slope and distinct individual bias voltages via resistors $R_{G,1}$, $R_{G,2}$, $R_{G,3}$, $R_{G,4}$, through $R_{G,N}$ as previously described. In the ON operational mode switch 1102 is in the top position, wherein the positive bias voltage of +3 V ($V_{ctrl,on}$) is equally impressed upon all of the gates of each of the transistors. As can be seen in FIG. 11, both the top and bottom of the previously described resistor string will receive equal voltages (+3 V) and thus all of the gates of the transistors in the switch will also be biased to the same gate voltage.

Figure 12:
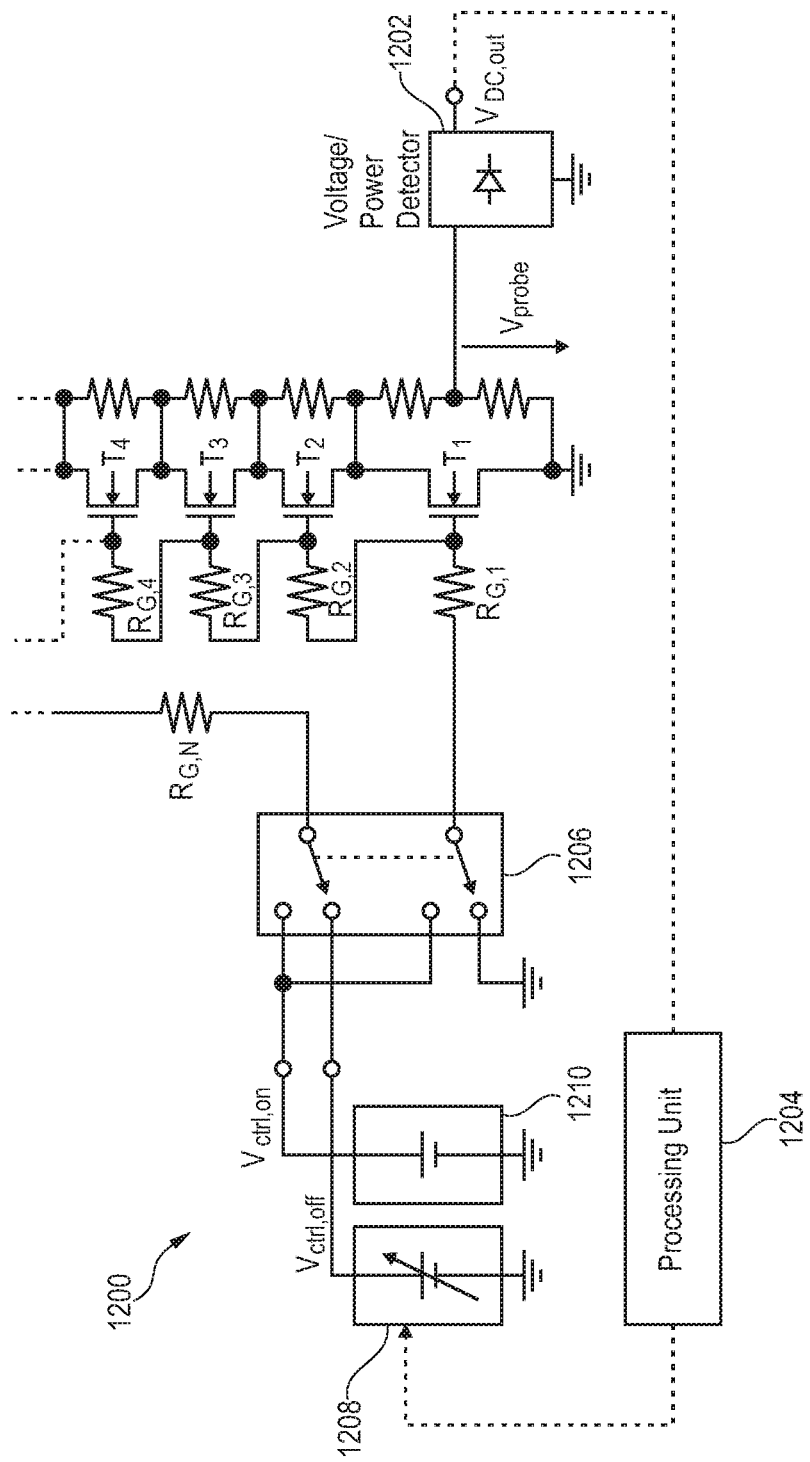
FIG. 12 is a schematic diagram of an adaptive bias control circuit for providing an enhancement biasing voltage only at higher switch power levels, according to an embodiment.

FIG. 12 is a schematic diagram of an adaptive bias control circuit 1200 for providing an enhancement biasing voltage only at higher switch power levels, according to an embodiment. The circuit 1200 of FIG. 12 is substantially similar to the circuit of FIG. 11, except that it includes a voltage/power detector 1202 having an input coupled to a center tap ($V_{probe}$) of a resistor divider across the drain-source of transistor $T_1$, and an output of the detector 1202 being coupled to the OFF control voltage 1208. In FIG. 12, the ON control voltage is labeled 1210 and the previously described switch is labeled 1206.

In operation, the power detector 1202 monitors the $V_{probe}$ node. At lower RF switch input powers, a high value of gate bias voltage may not be needed and thus a nominal value of $V_{ctrl,off}$ may be used. At higher RF switch input power, however, a higher value of gate bias voltage according to embodiment may be needed to avoid distortion, and thus a higher value of $V_{ctrl,off}$ may be used. The processing unit 1204 may be programmed to discriminate between higher and lower input power values by comparing the measured power value to an intermediate predetermined power value, or by using a look-up table, or by using various other algorithms that are known to those skilled in the art.

Embodiments described above can be used to improve internal circuit parameters. This circuit improvement can in turn result in an improvement in switch system parameters (higher $V_{RF}$, higher $R_{off}$, lower $C_{off}$) or in reducing area consumption (lower stacking).

Thus, embodiments of a biasing arrangement having a sloped bias voltage with respect to transistor rank number has been described for use in a high voltage RF switch stack to improve internal circuit parameters. The number of switches or switch cells in the stack can range between 6 and 80, with a sub-range of 15 to 70 in an embodiment. The exact number of switches or switch cells can vary in a particular application and will be determined mainly by the breakdown voltage of the switches or switch cells and the applied RF voltage. The individual bias gate voltages have a predefined linear slope as a function of the position in the stack, in an embodiment. The individual bias gate voltages varying monotonously and preferably smoothly, but not necessarily linearly in an embodiment. For example, quadratic, exponential, or logarithmic curves may be useful to provide a "predefined slope" that gently changes as a function of the stack position to account for additional aspects of a particular application that would be revealed in a detailed simulation of that particular application. It will be understood by those skilled in the art that minor variations from the linear or non-linear curves described above are contemplated due to the limits of the semiconductor process used. For example, minor variations in the value of biasing resistors and other components can cause slight variations from the ideal designed linear slope or curve.

In operation, a method of operating an RF switch comprises a plurality of serially coupled RF switch cells, the method comprising individually biasing each of the RF switch cells to a distinct bias voltage based upon a rank number of the RF switch cell. The distinct bias voltages vary between a first voltage and a second voltage in at least a portion of the RF switch. The distinct bias voltages may vary linearly between the first voltage and the second voltage in embodiments. The method can further comprise monitoring an internal node of the RF switch to provide a monitored output voltage, and adjusting the distinct bias voltages in response to the monitored output voltage. The method can further include individually biasing each of the RF switch cells to the distinct bias voltage in a first mode of operation, and biasing each of the RF switch cells to an equal bias voltage in a second mode of operation.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An RF switch comprising:
    a plurality of series-coupled RF switch cells coupled between an RF input and ground, each RF switch cell having an input; and
    a biasing network having a plurality of outputs configured for individually biasing each of the RF switch cell inputs to a distinct bias voltage based upon a rank number of the RF switch cell,
    wherein each RF switch cell comprises a first current node and a second current node, wherein the first current node of a first RF switch cell is coupled to the RF input, and wherein the second current node of a last RF switch is coupled to ground, and
    wherein the biasing network further comprises a switch configured for biasing the RF switch cell inputs to the distinct negative bias voltages based upon the rank number of the RF switch cell in an off mode of operation of the plurality of series-coupled RF switch cells, and for biasing the RF switch cell inputs to an equal positive bias voltage in an on mode of operation of the plurality of series-coupled RF switch cells, and wherein the distinct negative bias voltages comprise a plurality of different voltage values in the off mode and the equal positive bias voltage comprises a single voltage value in the on mode.

2. The RF switch of claim 1, wherein the distinct bias voltages range from a first voltage associated with a first RF switch cell of the plurality of series-coupled RF switch cells to a second voltage associated with a last RF switch cell of the plurality of series-coupled RF switch cells and different from the first voltage.

3. The RF switch of claim 2, wherein the distinct bias voltages range linearly from the first voltage to the second voltage.

4. The RF switch of claim 1, wherein each RF switch cell of the plurality of series-coupled RF switch cells comprises a transistor having a control node forming the input of the RF switch cell.

5. The RF switch of claim 4, wherein each RF switch cell of the plurality of series-coupled RF switch cells further comprises a resistor and a capacitor coupled across the first and second current nodes of the transistor.

6. The RF switch of claim 1, further comprising a power detector configured for adjusting the distinct bias voltages.

7. An RF switch comprising:
a plurality of series-coupled RF switch cells coupled between a first RF input and a second RF input, each RF switch cell having an input; and
a biasing network having a plurality of outputs configured for individually biasing each of the RF switch cell inputs to a distinct bias voltage based upon a rank number of the RF switch cell,
wherein each RF switch cell comprises a first current node and a second current node, wherein the first current node of a first RF switch cell is coupled to the first RF input, and wherein the second current node of a last RF switch is coupled to the second RF input, and
wherein the biasing network further comprises a switch configured for biasing the RF switch cell inputs to the distinct negative bias voltages based upon the rank number of the RF switch cell in an off mode of operation of the plurality of series-coupled RF switch cells, and for biasing the RF switch cell inputs to an equal positive bias voltage in an on mode of operation of the plurality of series-coupled RF switch cells, and wherein the distinct negative bias voltages comprise a plurality of different voltage values in the off mode and the equal positive bias voltage comprises a single voltage value in the on mode.

8. The RF switch of claim 7, wherein the distinct bias voltages range from a first voltage associated with a first RF switch cell of the plurality of series-coupled RF switch cells to a second voltage associated with an intermediate RF switch cell of the plurality of series-coupled RF switch cells and different from the first voltage, and from a third voltage associated with a last RF switch cell of the plurality of series-coupled RF switch cells and different from the second voltage to the second voltage associated with the intermediate RF switch cell.

9. The RF switch of claim 8, wherein the distinct bias voltages range linearly from the first voltage to the second voltage, and from the third voltage to the second voltage.

10. The RF switch of claim 7, wherein each RF switch cell of the plurality of series-coupled RF switch cells comprises a transistor having a control node forming the input of the RF switch cell.

11. The RF switch of claim 10, wherein each RF switch cell of the plurality of series-coupled RF switch cells further comprises a resistor and a capacitor coupled across the first and second current nodes of the transistor.

12. The RF switch of claim 7, further comprising a power detector configured for adjusting the distinct bias voltages.

13. A method of operating an RF switch comprising a plurality of serially coupled RF switch cells, wherein each RF switch comprises first and second current nodes and an input node, wherein the first current node of a first RF switch is coupled to a first RF input, and wherein the second current node of a second RF switch is coupled to a second RF input or ground, the method comprising individually biasing each input node of the RF switch cells to a distinct negative bias voltage based upon a rank number of the RF switch cell in an off mode of operation of the plurality of serially coupled RF switch cells, and biasing each input node of the RF switch cells to an equal positive bias voltage in an on mode of operation of the plurality of serially coupled RF switch cells, such that each RF switch cell has a unique and different bias voltage value in the off mode of operation, and each RF switch has a same bias voltage value in the on mode of operation.

14. The method of claim 13, wherein the distinct bias voltages vary between a first voltage and a second voltage in at least a portion of the RF switch.

15. The method of claim 14, wherein the distinct bias voltages vary linearly between the first voltage and the second voltage.

16. The method of claim 13, further comprising monitoring an internal node of the RF switch to provide a monitored output voltage.

17. The method of claim 16, further comprising adjusting the distinct bias voltages in response to the monitored output voltage.

18. An RF switch comprising:
a plurality of series-coupled RF switch cells coupled between an RF input and ground, each RF switch cell having an input; and
a biasing network having a plurality of outputs configured for individually biasing each of the RF switch cell inputs to a distinct bias voltage based upon a rank number of the RF switch cell,
wherein the biasing network further comprises a switch configured for biasing the RF switch cell inputs to the distinct negative bias voltages based upon the rank number of the RF switch cell in an off mode of operation of the plurality of series-coupled RF switch cells, and for biasing the RF switch cell inputs to an equal positive bias voltage in an on mode of operation of the plurality of series-coupled RF switch cells, and wherein the distinct negative bias voltages comprise a plurality of different voltage values in the off mode and the equal positive bias voltage comprises a single voltage value in the on mode.

* * * * *